(12) United States Patent
Chan et al.

(10) Patent No.: US 10,090,466 B2
(45) Date of Patent: Oct. 2, 2018

(54) FAR-INFRARED DETECTION USING WEYL SEMIMETALS

(71) Applicant: MASSACHUSETTS INSTITUTE OF TECHNOLOGY, Cambridge, MA (US)

(72) Inventors: Ching-Kit Chan, Los Angeles, CA (US); Patrick A. Lee, Brookline, MA (US); Netanel Lindner, Aviel (IL); Gil Refael, Pasadena, CA (US); Qiong Ma, Cambridge, MA (US); Suyang Xu, Cambridge, MA (US); Nuh Gedik, Watertown, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/656,373

(22) Filed: Jul. 21, 2017

(65) Prior Publication Data

US 2018/0026185 A1   Jan. 25, 2018

Related U.S. Application Data

(60) Provisional application No. 62/365,064, filed on Jul. 21, 2016.

(51) Int. Cl.
   *G01J 1/44* (2006.01)
   *G01J 1/04* (2006.01)
   *H01L 49/00* (2006.01)

(52) U.S. Cl.
   CPC .......... *H01L 49/003* (2013.01); *G01J 1/0429* (2013.01); *G01J 1/44* (2013.01); *G01J 2001/4446* (2013.01)

(58) Field of Classification Search
   CPC .... G01J 1/0429; G01J 1/44; G01J 2001/4446; H01L 49/003
   See application file for complete search history.

(56) References Cited

U.S. PATENT DOCUMENTS

| 4,103,144 A | 7/1978 | Pizzarello et al. |
|---|---|---|
| 5,449,924 A | 9/1995 | Hur et al. |
| 8,238,026 B1 | 8/2012 | Kemme et al. |
| 8,299,497 B1 | 10/2012 | Klem et al. |
| 2004/0173865 A1 | 9/2004 | Scales et al. |

(Continued)

OTHER PUBLICATIONS

A. A. Burkov, "Chiral anomaly and transport in Weyl metals," arXiv:1502.07609v1, 35 pages (Feb. 2015).

(Continued)

*Primary Examiner* — Mark R Gaworecki
(74) *Attorney, Agent, or Firm* — Smith Baluch LLP

(57) ABSTRACT

The generation of photocurrent in an ideal two-dimensional Dirac spectrum is symmetry forbidden. In sharp contrast, a three-dimensional Weyl semimetal can generically support significant photocurrent due to the combination of inversion symmetry breaking and finite tilts of the Weyl spectrum. To realize this photocurrent, a noncentrosymmetric Weyl semimetal is coupled to a pair of electrodes and illuminated with circularly polarized light without any voltage applied to the Weyl semimetal. The wavelength of the incident light can range over tens of microns and can be adjusted by doping the Weyl semimetal to change its chemical potential.

20 Claims, 8 Drawing Sheets

(56) References Cited

U.S. PATENT DOCUMENTS

| | | |
|---|---|---|
| 2005/0110108 A1 | 5/2005 | Patel et al. |
| 2014/0217284 A1 | 8/2014 | So et al. |
| 2015/0109606 A1 | 4/2015 | Peale et al. |
| 2017/0138844 A1* | 5/2017 | Xu .......................... C22C 29/00 |

OTHER PUBLICATIONS

A. A. Burkov, M. D. Hook, and L. Balents, "Topological nodal semimetals," arXiv:1110.1089v2, 16 pages (Dec. 2011).

A. A. Soluyanov, D. Gresch, Z. Wang, Q. Wu, M. Troyer, X. Dai, and B. A. Bernevig, "Type II Weyl Semimetals," arXiv:1507.01603v2, 12 pages (Dec. 2015).

A. Abanov, V. L. Pokrovsky, W. M. Saslow, and P. Zhou, "Ph Spin resonance in a quantum wire: Anomalous effects of an applied magnetic fields," Phys. Rev. B 85, 085311-1-7 (2012).

A. H. Castro Neto, F. Guinea, N. M. R. Peres, K. S. Noveoselov, and A. K. Geim, "The electronic properties of graphene," arXiv:0709.1163v2, pp. 55 pages (Jan. 2009).

A. Junck, G. Refael, and F. von Oppen, "Photocurrent Response of Topological Insulator Surface States," arXiv:1301.4392v1, 8 pages (Jan. 2013).

B. Q. Lv, H. M. Weng, B. B. Fu, X. P. Wang, H. Miao, J. Ma, P. Richard, X. C. Huang, L. X. Zhao, G. F. Chen, Z. Fang, X. Dai, T. Qian, and H.Ding, "Experimental Discovery of Weyl Semimetal TaAs", Phys. Rev. X 5, 031013-1-10 (Mar. 2015).

C. Zhang, Z. Yuan, S. Xu, Z. Lin, B. Tong, M. Zahid Hasan, J. Wang, C. Zhang, and S. Jia, "Tantalum Monoarsenide: an Exotic Compensated Semimetal," arXiv:1502.00251v1, 14 pages (Feb. 2015).

C.-K. Chan, N. H. Lindner, G. Refael, and P. A. Lee, "Photocurrents in Weyl semimetals," Physical Review B 95, 041104-1-5 (2017).

C.-K. Chan, P. A. Lee, K. S. Burch, J. H. Han, and Y. Ran, "When Chiral Photons Meet Chiral Fermions—Photoinduced Anomalous Hall Effects in Weyl Semimetals," arXiv:1509.05400v2, 9 pages (Dec. 22, 2015).

E. L. Ivchenko and G. E. Pikus, Superlattices and Other Heterostructures: Symmetry and Optical Phenomena, 2nd ed., Springer Series in Solid-State Sciences, chapter 10.5, 45 pages (Jan. 1997).

F. de Juan, A. G. Grushin, T. Morimoto, and J. E. Moore, "Quantized circular photogalvanic effect in Weyl semimetals," arXiv:1611.05887v1, 9 pages (Nov. 2016).

F. H. L. Koppens, T. Mueller, P. Avouris, A. C. Ferrari, M. S. Vitiello, and M. Polini, "Photodetectors based on graphene, other two-dimensional materials and hybrid systems," Nat Nanotechnology, published online Oct. 6, 2014 doi:10.1038/nnano.2014.215, 14 pages (2014).

H. Ishizuka, T. Hayata, M. Ueda, and N. Nagaosa, "Emergent Electromagnetic Induction and Adiabatic Charge Pumping in Weyl Semimetals," arXiv:1607.06537v1, 5 pages (Jul. 2016).

H. Weng, C. Fang, Z. Fang, B. A. Bernevig, and X. Daim, "Weyl Semimetal Phase in Noncentrosymmetric Transition-Metal Monophosphides," Physical Review X 5, 011029-1-10 (Mar. 2015).

J. Hu, J. Y. Liu, D. Graf, S. M. A. Radmanesh, D. J. Adams, A. Chuang, Y. Wang, I. Chiorescu, J. Wei, L. Spinu, and Z. Q. Mao, "π Berry phase and Zeeman splitting of Weyl semimetal TaP," Scientific Reports 6, 18674 EP, 8 pages (2016).

J. W. McIver, D. Hsieh, H. Steinberg, P. Jarillo-Herrero, and N. Gedik, "Na Control over topological insulator photocurrents with light polarization," Nat Nano 7, 96, 15 pages (2012).

J.-B. Masson and G. Gallot, "Terahertz achromatic quarter-wave plate," Opt. Lett . 31(2), pp. 265-267 (Jan. 2006).

K. Kuroda, J. Reimann, J. Güdde, and U. Höfer, "Generation of Transient Photocurrents in the Topological Surface State of $Sb_2Te_3$ by Direct Optical Excitation with Mid-Infrared Pulses," arXiv:1511.00460v2, 5 pages (Jan. 2016).

K. N. Okada, N. Ogawa, R. Yoshimi, A. Tsukazaki, K. S. Takahashi, M. Kawasaki, and Y. Tokura, "Enhanced photogalvanic current in topological insulators via Fermi energy tuning," arXiv:1601.04290v1, 12 pages (Jan. 2016).

K. Taguchi, T. Imaeda, M. Sato, and Y. Tanaka, "Photovoltaic Chiral Magnetic Effect," arXiv:1601.00379v1, 5 pages (Jan. 2016).

K. W. Kim, T. Morimoto, and N. Nagaosa, "Shift charge and spin photocurrents in Dirac surface states of topological insulator," arXiv:1607.03888v1, 12 pages (Jul. 2016).

L. Wu, S. Patankar, T.Morimoto, N. L. Nair, E. Thewalt, A. Little, J. G. Analytis, J. E. Moore, and J. Orenstein, "Giant anisotropic nonlinear optical response in transition metal monopnictide Weyl semimetals," arXiv:1609.04894v3, 10 pages (Apr. 2017).

M. Razeghi and B.-M. Nguyen, "Advances in mid-infrared detection and imaging: a key issues review," Reports on Progress in Physics 77, 17 pages (2014).

M. Trescher, B. Sbierski, P. W. Brouwer, and E. J. Bergholtz, "Quantum transport in Dirac materials: Siganture of tilted and anisotropic Dirac and Weyl cones," arXiv:1501.04034v2, 6 pages (Apr. 2015).

M. Z. Hasan and C. L. Kane, "*Colloquium*: Topical Indicators," Rev. Mod. Phys. 82, pp. 3045-3067 (Oct.-Dec. 2010).

N. H. Lindner, A. Farrell, E. Lustig, G. Refael, and F. von Oppen, "Lighting up topological insulators: Large surface photocurrents from magnetic superlattices," arXiv:1403.0010v2, 16 pages (Dec. 2015).

O. Vafek and A. Vishwanath, "Dirac Fermions in Solids—from High Tc cuprates and Graphene to Topological Insulators and Weyl Semimetals," arXiv:1306.2272v1, 46 pages (Jun. 2013).

P. E. Sieber and D. H. Werner, "Infrared broadband quarter-wave and half-wave plates synthesized from anisotropic Bézier metasurfaces," Opt. Express, vol. 22, No. 6, 32371-32383 (Dec. 2014).

P. Hosur, "Circular photogalvanic effect on topological insulator surfaces: Berry-curvature-dependent response," Physical Review B 83, 035309-1-7 (2011).

P. Hosur, S. A. Parameswaran, and A. Vishwanath, "Charge Transport in Weyl Semimetals," arXiv:1109.6330v2, 9 pages (Nov. 2011).

Q. Ma, S.-Y Xu, C.-K. Chan, C. -L. Zhang, G. Chang, Y. Lin, W. Xie, T. Palacios, H. Lin, S. Jia, P. A. Lee, P. Jarillo-Herrero, and N. Gedik, "Direct optical detection of Weyl fermion chirality in a topological semimetal," Nature Physics, published online May 29, 2017 doi:10.1038/nphys4146, pp. 754-755 (2017).

S. D. Ganichev, S. N. Danilov, V. Bel'kovc, E. L. Iychenko, H. Ketterla, L. E. Vorobjev, M. Bichlerd, W.Wegscheider, and W. Prettl, "Nonlinear photogalvanic effect induced by monopolar spin orientation of holes in QWs," Physica E 10, pp. 52-56 (2001).

S. Jeon, B. B. Zhou, A. Gyenis, B. E. Feldman, I. Kimchi, A. C. Potter, Q. D. Gibson, R. J. Cava, A. Vishwanath, and A. Yazdani, "Landau Quantization and Quasiparticle Interference in the Three-Dimensional Dirac Semimetal $Cd_3As_2$," Nat Mater 13, 851, 32 pages (2014).

S. Zhong, J. E. Moore, and I. Souza, "Gyrotropic Magnetic Effect and the Magnetic Moment on the Fermi Surface," arXiv:1510.02167v3, 6 pages (Feb. 2016).

S. Zhong, J. Orenstein, and J. E. Moore, "Optical gryotropy from axion electrodynamics in momentum space," arXiv:1503.02715v3, 7 pages (Oct. 2015).

S.-M. Huang, S.-Y. Xu, I. Belopolski, C.-C. Lee, G. Chang, B. Wang, N. Alidoust, G. Bian, M. Neupane, C. Zhang, S. Jia, A. Bansil, H. Lin, and M. Z. Hasan, "A Weyl Fermion semimetal with surface Fermi arcs in the transition metal monopnictide TaAs class," Nat Commun 6, 6 pages (Jun. 2015).

S.-Y. Xu, N. Alidoust, I. Belopolski, Z. Yuan, G. Bian, T.-R. Chang, H. Zheng, V. N. Strocov, D. S. Sanchez, G. Chang, C. Zhang, C. Mou, Y. Wu, L. Huang, C.-C. Lee, S.-M. Huang, B. Wang, A. Bansil, H.-T. Jeng, T. Neupert, A. Kaminski. H. Lin, S. Jia, and M. Z. Hasan, "Discovery of a Weyl fermion state with Fermi arcs in niobium arsenide," Nature Physics, vol. 11, published online Aug. 17, 2015 doi:10.1038/nphys3437, pp. 748-755 (Aug. 2015).

S.-Y. Xu, I. Belopolski, N. Alidoust, M. Neupane, G. Bian, C. Zhang, R. Sankar, G. Chang, Z. Yuan, C.C. Lee, S.-M. Huang, H. Zheng, J. Ma, D. S. Sanchez, B. Wang, A. Bansil, F. Chou, P. P. Shibayev, H. Lin, S. Jia, and M. Z. Hasan, "Discovery of a Weyl Fermion Semimetal and Topological Fermi Arcs," Science 349, 613, 21 pages (2015).

(56) References Cited

OTHER PUBLICATIONS

T. Morimoto and N. Nagaosa, "Chiral anomaly and giant magnetochiral anisotropy in noncentrosymmetric Weyl semimetals," arXiv:1605.05409v2, 5 pages (Sep. 2016).
T. Morimoto and N. Nagaosa, "Scaling laws for nonlinear electromagnetic responses of Dirac fermions," arXiv:1510.02185v2, 9 pages (Mar. 2016).
X.-L. Qi and S.-C. Zhang, R., "Topological insulators and superconductors," arXiv:1008.2026v1, 54 pages (2011).
Y. B. Lyanda-Geller, S. Li, and A. V. Andreev, "Polarization-dependent photocurrents in polar stacks of van der Waals solids," arXiv:1509.02150v1, 5 pages (Sep. 2015).
Z. Chen, Y. Gong, H. Dong, T. Notake, and H. Minamide, "Terahertz Achromatic Quarter Wave Plate: Design, Fabrication, and Characterization," Optics Communications 311, 1, 18 pages (2013).
Z. Wang, D. Gresch, A. A. Soluyanov, W. Xie, S. Kushwaha, X. Dai, M. Troyer, R. J. Cava, and B. A. Bernevig, "MoTe$_2$: A Type-II Weyl Topological Metal," arXiv:1511.07440v2, 12 pages (Jul. 2016).
Z. Zhu, S. Joshi, and G. Moddel, "High Performance Room Temperature Rectenna IR Detectors Using Graphene Geometric Diodes," IEEE Journal of Selected Topics in Quantum Electronics, vol. 20, No. 6, 9 pages (Nov./Dec. 2014).
Batabyal, R. et al., "Visualizing "Fermi arcs" in the Weyl semimetal TaAs," arXiv:1603.00283.1, Mar. 1, 2016, 12 pages.
International Search Report and Written Opinion dated Oct. 12, 2017, from International Application No. PCT/US17/43329.
O'Brien, T. E. et al., "Magnetic breakdown and Klein tunneling in a type-II Weyl semimetal," arXiv:1604.01028v2, Apr. 19, 2016, 8 pages.
Xu, S.-Y. et al., "Experimental discovery of a topological Weyl semimetal state in TaP," *Science Advances* 2015; 1(10)e1501092, 9 pages.

\* cited by examiner

FAR-INFRARED DETECTION USING WEYL SEMIMETALS

CROSS-REFERENCE TO RELATED APPLICATION(S)

This application claims the priority benefit of U.S. Application No. 62/365,064, which was filed on Jul. 21, 2016, and is incorporated herein by reference in its entirety.

GOVERNMENT SUPPORT

This invention was made with Government support under Grant Nos. DE-FG02-03ER46076 and DE-FG02-08ER46521 awarded by the Department of Energy and Grant Nos. DMR-1419807 and DMR-1410435 awarded by the National Science Foundation. The Government has certain rights in the invention.

BACKGROUND

A conventional photodiode converts an incident photon into a photocurrent by exploiting material properties of a semiconductor. A semiconductor has an energy band structure with a band gap between a pair of adjacent energy levels as shown in FIG. 1, where E is band energy and k representing $k_x$, $k_y$, $k_z$ is the transverse momentum. The conduction and valence bands have quadratic dispersion as indicated by their quadratic curvatures.

A semiconductor absorbs incident photons whose energy matches the band gap energy. Each absorption creates an electron-hole pair in the semiconductor. Applying a voltage to the semiconductor causes the electrons and holes to propagate in opposite directions, creating a photocurrent whose amplitude is proportional to the number of photons absorbed per second by the semiconductor.

Not every material has an energy band structure with gaps between adjacent energy levels. Graphene, for example, has energy band structure with bands that touch each other at different points in momentum space as shown in FIG. 2. These intersection points are called Dirac points or Dirac vertices. They represent degeneracies between two energy bands with linear dispersion, which can be characterized as a linear change in energy E with spatial frequency $k_x$, $k_y$, or $k_z$. When viewed from one direction (e.g., the x, y, or z direction), a Dirac point appears at the intersection between the linear portions of the energy bands.

Electronic materials with band crossing excitations have recently attracted much interest in condensed matter physics. A two-dimensional (2D) Dirac spectrum describes the surface states of three-dimensional (3D) topological insulators and also the bulk excitations of graphene. Their gapless and topological characters have stimulated many electronic applications, one of which is the photovoltaic effect. The linearly crossing dispersions of Dirac systems can absorb photons with, ideally, arbitrarily long wavelength, making them possibly advantageous for infrared (IR) detections. Nevertheless, the generation of photocurrent from transitions between the topological surface states, defined as the spontaneous production of current without any applied voltage in response to exposure to light, vanishes for an ideal Dirac spectrum in 2D because of the symmetric excitations about the Dirac point. In fact, the resultant photocurrent may be negligible even if realistic perturbations including band curvatures, warpings, and Zeeman couplings are taken into account. To date, the generation of a substantial photocurrent in Dirac systems has involved either using high frequency light to produce a small effect due to the transition between bulk and surface states in topological insulators or external assistance, such as a theoretical proposal of coupling to a magnetic superlattice. (Similarly, quantum wires require external magnetic fields to create sizeable photocurrents.)

SUMMARY

Embodiments of the present technology include a detector comprising a detecting element and a pair of electrodes in electrical communication with the detecting element. The detecting element includes a noncentrosymmetric Weyl semimetal that produces a photocurrent in response to incident radiation. In operation, the electrodes conduct the photocurrent out of the noncentrosymmetric Weyl semimetal.

The detecting element can produce the photocurrent in an absence of an external bias voltage and/or in an absence of an applied magnetic field.

The noncentrosymmetric Weyl semimetal may have a three-dimensional band structure comprising a plurality of tilted Weyl cones. It may also have an energy band structure that lacks inversion symmetry. Its chemical potential may be within about 5 meV of a Weyl node. The noncentrosymmetric Weyl semimetal can have a thickness of substantially equal to or less than an absorption length of the noncentrosymmetric Weyl semimetal at a wavelength of the incident radiation. This thickness may be less than about 1 micron. The noncentrosymmetric Weyl semimetal may include $SrSi_2$, TaAs, $WTe_2$, $MoTe_2$, TaP, NbP, NbAs, $Ag_2Se$, $Ta_3S_2$, LaAlGe, PrAlGe, CoSi, and/or RhSi.

The electrodes may include a transparent electrode disposed on a first side of the Weyl semimetal and a back electrode disposed on a second side of the Weyl semimetal opposite the first side of the Weyl semimetal.

The detector may also include a polarizer to polarize the incident polarization in a linear polarization state and a quarter wave plate, in optical communication with the polarizer and the detecting element, to transform the incident radiation from the linear polarization state to a circular polarization state.

Embodiments of the present technology further include methods of detecting incident radiation. Examples of this method include illuminating a noncentrosymmetric Weyl semimetal with the incident radiation. The noncentrosymmetric Weyl semimetal generating a photocurrent in response to the incident radiation. And electrodes in electrical communication with the noncentrosymmetric Weyl semimetal conduct the photocurrent out of the noncentrosymmetric Weyl semimetal.

Illuminating the noncentrosymmetric Weyl semimetal may occurs in an absence of a bias voltage and/or in an absence of a magnetic field. The incident illumination may be near to far-infrared light (e.g., within a wavelength range of 10 to 150 microns). It may also be Terahertz radiation (e.g., within a frequency range of 2-30 THz). And it may be circularly polarized radiation.

Yet another embodiment of the present technology includes a detector comprising a Weyl semimetal and a pair of electrodes in electrical communication with the Weyl semimetal. The Weyl semimetal has a tilted Weyl dispersion and an energy band structure lacking inversion symmetry at a wavelength of the circularly polarized incident radiation. In operation, the Weyl semimetal produces a photocurrent in response to circularly polarized incident radiation. And the electrodes conduct the photocurrent out of the noncentrosymmetric Weyl semimetal.

In some cases, the Weyl semimetal has a thickness of substantially equal to or less than an absorption length and defines a surface configured to receive the circularly polarized incident radiation. In these cases, the electrodes comprises a first electrode at a first edge of the surface and a second electrode at a second of the surface.

In other cases, the Weyl semimetal has a thickness greater than an absorption length and defines a first surface configured to receive the circularly polarized incident radiation and the electrodes comprise a transparent electrode disposed on the first surface and a back electrode disposed on the a second surface of the Weyl semimetal, the second surface being opposite the first surface.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Figure 1:
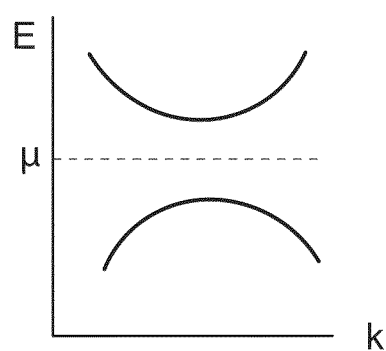
FIG. 1 shows an energy band gap in the energy band structure of a semiconductor.

The present technology relates to using Weyl semimetals to develop photocurrents without an external coupling. As understood by those of skill in the art, a Weyl semimetal is a solid-state material whose quasi-particle excitation is the Weyl fermion, which carries electrical charge at room temperature. A Weyl semimetal has an energy band structure, or Weyl spectrum, that is the 3D generalization of the Dirac cone and shares many of the same advantages with respect to long-wavelength photon absorption. Unlike Dirac systems, however, Weyl semimetals break either time-reversal (TR) symmetry, spatial inversion (I) symmetry, or both. And the photocurrent response of a Weyl system differs from the Dirac counterpart in at least two ways.

First, a Weyl system includes Weyl cones that have definite chiralities and come in pairs. Weyl cones can be regarded as topological monopoles or anti-monopoles of the Berry curvature. For upright Weyl cones, the absorption of a circularly polarized photon flips the spin, resulting in asymmetric excitations along the drive direction. The direction of the photocurrent is governed by the chirality, so the sum of photocurrents from a Weyl node pair vanishes identically.

Second, Weyl cones can be tilted because of reduced symmetries. The Weyl cones are generically tilted in $SrSi_2$, TaAs, $WTe_2$, $MoTe_2$, TaP, NbP, NbAs, $Ag_2Se$, $Ta_3S_2$, LaAlGe, PrAlGe, CoSi, and RhSi. The corresponding photoexcitation is highly asymmetric about the nodal points. The consequential photocurrent is controlled by the tilt and the chirality of the Weyl cones. There is generally no offset between photocurrents unless additional symmetries are imposed. Note that other interesting effects, such as gyrotropic magnetic effect, photovoltaic chiral magnetic effect, anomalous Hall effect, emergent electromagnetic induction, and nonlinear optical responses, can occur in Weyl semimetals, but have different physical origins.

Photocurrents in systems without I symmetry have been observed in semiconductor quantum wells and tellurium. A variety of mechanisms have been discussed, including real and virtual absorptions and spin-dependent scatterings, but the effect is small and the discussion has been limited to quadratic band structures. The linear dispersion in Weyl semimetals has an advantage over these other effects: they can be used to produce a large photocurrent, proportional to the absorption, that survives up to room temperature. In addition, the gapless nature of the Weyl dispersion implies that the system can absorb photons with, ideally, arbitrary long wavelength, making this system useful for far-infrared and terahertz applications.

In addition to the broken I-symmetry, the presence of finite tilts of the Weyl dispersions, being commonplace in realistic materials, helps generate photocurrent in Weyl semimetals. The photocurrent response does not require tuning the chemical potential to the Weyl point or imbalancing chemical potentials between opposite Weyl nodes. (This tuning and imbalancing can be useful for chiral-anomaly related responses.)

Symmetry analyses and perturbative calculations show that noncentrosymmetric Weyl semimetals can generate significant photocurrents. The photovoltaic process is a consequence of broken I symmetry and finite tilts of the dispersions, which are unique to Weyl systems. The effect remains significant in a large window of operating parameters, including temperature (e.g., from room temperatures (275-300 K) to liquid helium temperature (4.8 K)), chemical potential, and frequency of the light source. The photocurrent can be readily detected using standard laser experiment techniques and existing Weyl materials. This makes Weyl semimetals suitable for detecting infrared (IR) light at room temperature.

Figure 2C:
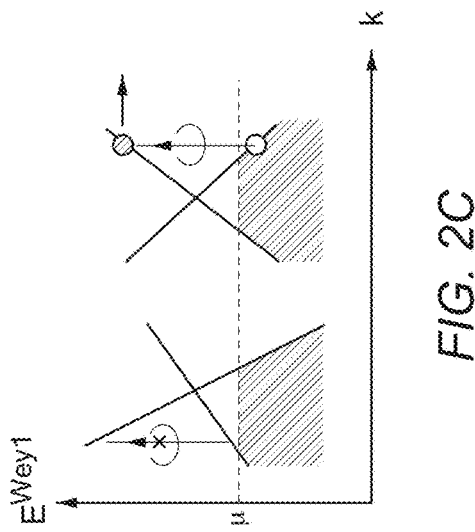
FIG. 2C shows an energy-band schematic of photocurrent generation in a Weyl semimetal with a tilt of the energy band along a transverse dimension (tilted Weyl cones).
Figure 2B:
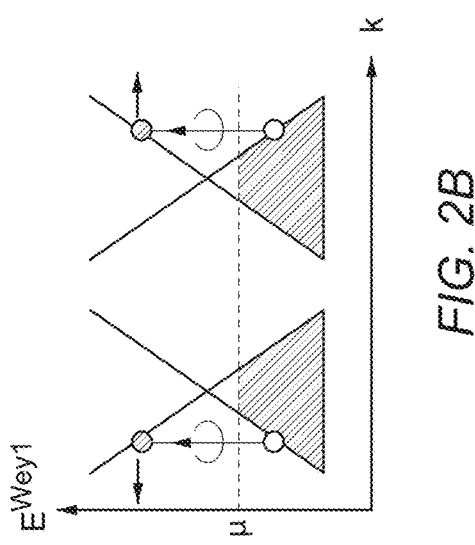
FIG. 2B shows an energy-band schematic of photocurrent generation in a Weyl semimetal with an upright crossing spectrum (upright Weyl cones).
Figure 2A:
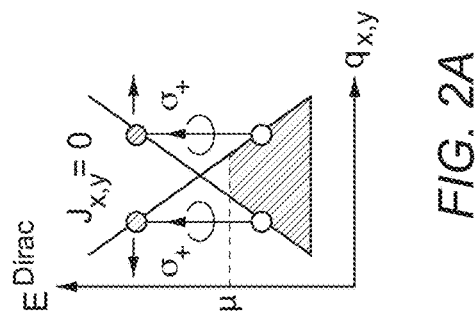
FIG. 2A shows an energy-band schematic of photocurrent generation in an ideal 2D Dirac system.

FIGS. 2A-2C illustrate photon absorption and photocurrent generation in materials whose band structures are characterized by a Dirac cone, upright Weyl cones, or tilted Weyl cones. In FIG. 2A, circularly polarized light illuminates a Dirac material, such as graphene, whose energy band structure includes a Dirac cone. Compared to a conventional semiconductor, where the conduction and valence bands have quadratic dispersion and are separated by an energy gap as shown in FIG. 1, the energy band structure shown in FIG. 2A shrinks to zero and the energy band disperses linearly in all directions at the Dirac point. With no voltage applied to the material, the incident light produces symmetric excitations on opposite sides of the Dirac point (the vertex of the Dirac cone). These symmetric excitations cancel each other, resulting in no net photocurrent.

FIG. 2B illustrates photon absorption by a centrosymmetric Weyl semimetal whose energy band structure is characterized by a pair of upright Weyl cones. In a Weyl semimetal, the energy band gap shrinks to zero and the energy band disperses linearly in all three directions at the band crossings. As stated above, the gapless band crossing points at the vertices of the Weyl cones are called Weyl nodes and occur in pairs as shown in FIG. 2B. In a centrosymmetric Weyl semimetal, the Weyl cones have opposite chirality and opposite tilt (e.g., zero tilt as shown in FIG. 2B).

When circularly polarized light illuminates the Weyl semimetal shown in FIG. 2B, the Weyl semimetal absorbs the light on one side but not the other side of each Weyl node due to the nodes' opposite chiralities. This produces an electron and hole pair moving in opposite directions, hence a net current for each node. However, in the presence of inversion symmetry, the currents from the pair of Weyl nodes cancel each other, as shown in FIG. 2B.

FIG. 2C illustrates absorption of circularly polarized light by a non-centrosymmetric Weyl semimetal, which has a tilted energy band near a pair of Weyl nodes with the same chirality. The tilts of the nodes are generally unrelated and can be different. Because the nodes have the same chirality and different tilts, the current produced by absorbing a circularly polarized photon is not cancelled. (Changing from left-handed to right-handed circular polarization flips the direction of the photocurrent.) This current can be very large: for every photon absorbed, the current is a fraction of that carried by an electron moving at the velocity corresponding to the linear dispersion, which is typically $10^8$ cm/sec.

Photovoltaic effects have been discussed in conventional non-centrosymmetric semiconductors and quantum wells for many years. There the effect is very small because the current produced by an electron moving at the bottom of a quadratic band is very small and in addition one relies on a small asymmetry between currents moving in opposite directions. In contrast, the current per photon is about four orders of magnitude higher in a Weyl semimetal. In addition, while the light frequency that can be absorbed is limited by the band gap in semiconductors, in Weyl semimetals it is limited by the position of the chemical potential $\mu$ relative to the position of the Weyl node as shown in FIG. 2C. The chemical potential can be controlled by using different materials or by doping the Weyl semimetal with carriers, making it possible to tailor the Weyl semimetal's absorption frequency based on the application.

Thin-Film Weyl Semimetal Photodetectors

Figure 3:
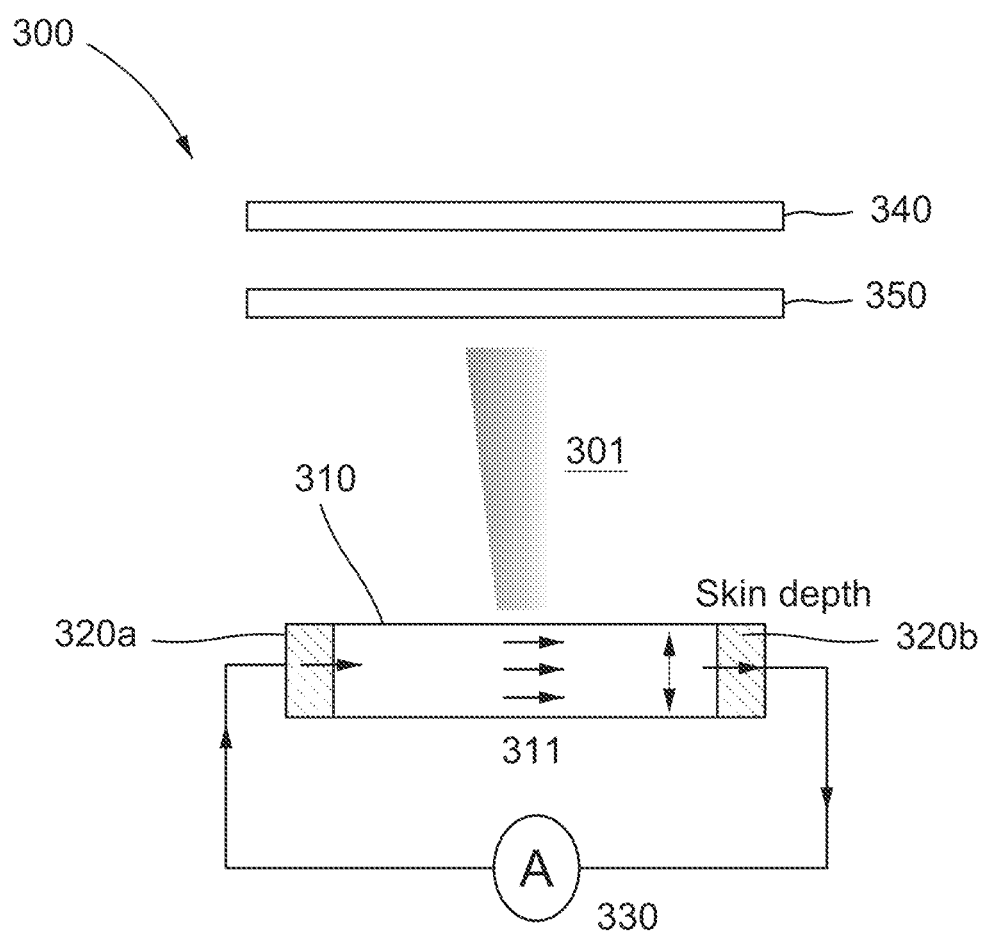
FIG. 3 shows a thin-film Weyl semimetal photodetector that generates photocurrent flowing orthogonal to the incident radiation.

FIG. 3 shows a photodetector 300 that includes a thin film of noncentrosymmetric Weyl semimetal 310. Electrodes 320a and 320b (collectively, electrodes 320) at either end of the Weyl semimetal 310 connect the photodetector 300 to a load 330. In some cases, the photodetector 300 also includes a polarizer 340 and a quarter wave plate 350 in optical series with the Weyl semimetal 310.

The Weyl semimetal 310 is noncentrosymmetric and has an energy band structure like the one shown in FIG. 2C. Suitable Weyl semimetals include, but are not limited to $SrSi_2$, $TaAs$, $WTe_2$, $MoTe_2$, $TaP$, $NbP$, $NbAs$, $Ag_2Se$, $Ta_3S_2$, $LaAlGe$, $PrAlGe$, $CoSi$, and $RhSi$. The Weyl semimetal 310 may be selected or doped such that its chemical potential $\mu$ ranges from about 100 meV below the Weyl nodes to about 100 meV above the Weyl nodes in the Weyl semimetal's energy band structure. (The dopants depend on the compound. For instance, for TaAs, the dopant can either be a "foreign" element like Si, or it can be just a slight deviation from stoichiometry, like $TaAs_{1+x}$) For instance, the chemical potential may be about 50, 40, 30, 20, or 10 meV above or below the Weyl nodes. The chemical potential can be selected such that the Weyl semimetal 310 absorbs light within a wavelength range of about 10 μm to about 50 μm (e.g., 10 μm, 20 μm, 30 μm, 40 μm, or 50 μm).

The Weyl semimetal 310 has a thickness comparable to its absorption length at the photodetector's operating wavelength. The absorption length is the scale at which all or substantially all of the incident photons are used for photo-excitations. It is estimated to be a few hundred nanometers, which is comparable to the skin depth. For instance, the Weyl semimetal's thickness may range from about 10% to about 250% of the absorption length (e.g., 25%, 50%, 75%, 100%, 125%, or 150% of the absorption length). Expressed in absolute terms, the Weyl semimetal's thickness may be about 500 nm to about 5 μm (e.g., 1 μm, 2 μm, 3 μm, 4 μm, or 5 μm).

In operation, incident radiation 301 illuminates the photodetector 300, generating a photocurrent 311 that flows to the load 330. If the incident polarization is unpolarized, the polarizer 340 linearly polarizes the incident radiation 301 along a predetermined direction. The quarter wave plate 350 transforms the incident radiation's polarization state from the linear state transmitted by the polarizer 340 to a circular polarization state.

The circularly polarized radiation 301 illuminates the surface of the Weyl semimetal 310 as shown in FIG. 3. The Weyl semimetal 310 absorbs the circularly polarized radiation to produce a photocurrent 311 that propagates in a direction orthogonal to the propagation direction of the incident radiation 301 as explained above with respect to FIG. 2C. The electrodes 320, which are at the edges of the Weyl semimetal 310, conduct the photocurrent 310 to the load 330.

Thick-Film Weyl Semimetal Photodetectors

Figure 4A:
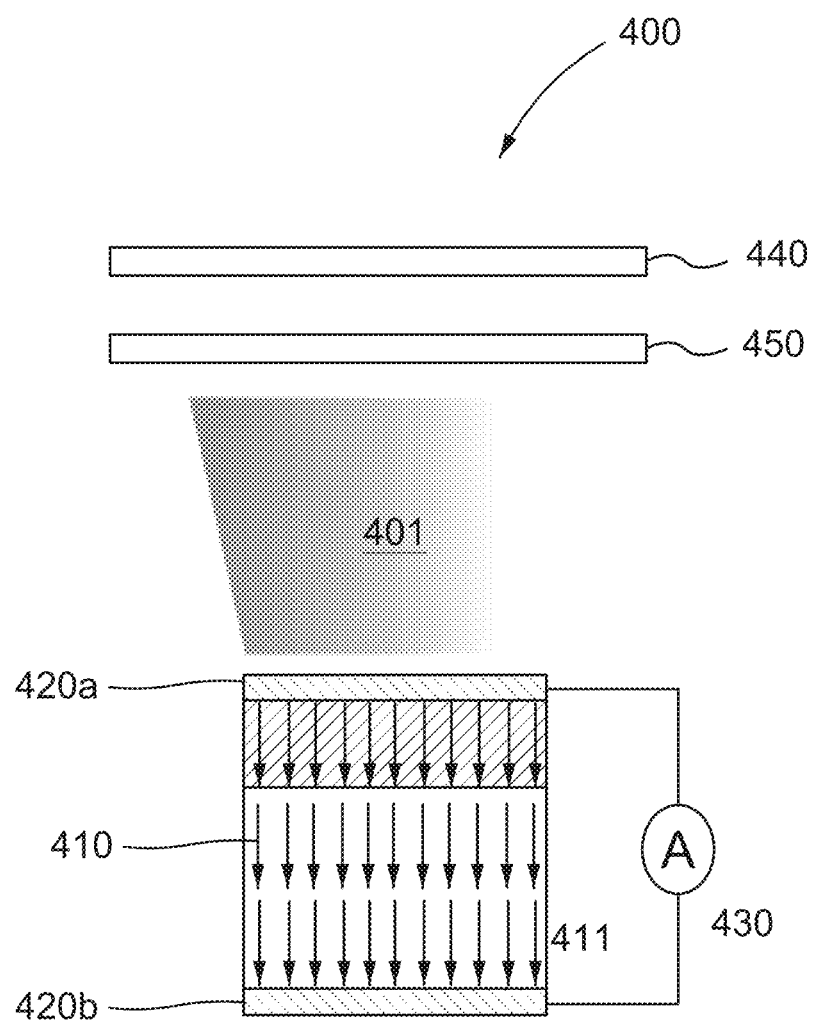
FIG. 4A shows an alternative Weyl semimetal photodetector that generates photocurrent flowing parallel to the incident radiation.

FIG. 4A shows an alternative Weyl semimetal photodetector 400 that does not require thin films. This photodetector 400 includes a Weyl semimetal 410 whose thickness can be (significantly) greater than the absorption length at the operating wavelength. For instance, the Weyl semimetal's thickness can range from a few hundred nanometers to millimeters. It also includes a transparent electrode 420a (e.g., an indium tin oxide (ITO) electrode) disposed on or attached to the top of the Weyl semimetal 410 from the transparent electrode 420a. Another electrode 420b is disposed on the opposite side of the Weyl semimetal 410. The electrodes 420a and 420b are connected to a load 430. An optional polarizer 440 and quarter wave plate 450 are in optical series with the transparent electrode 420a and the Weyl semimetal 450.

The Weyl semimetal 410 is noncentrosymmetric and has an energy band structure like the one shown in FIG. 2C. Suitable Weyl semimetals include, but are not limited to $SrSi_2$, TaAs, $WTe_2$, $MoTe_2$, TaP, NbP, NbAs, $Ag_2Se$, $Ta_3S_2$, LaAlGe, PrAlGe, CoSi, and RhSi. The Weyl semimetal 410 may be selected or doped such that its chemical potential $\mu$ ranges from about 100 meV below the Weyl nodes to about 100 meV above the Weyl nodes in the Weyl semimetal's energy band structure. For instance, the chemical potential may be about 50, 40, 30, 20, or 10 meV above or below the Weyl nodes. The chemical potential can be selected such that the Weyl semimetal 310 absorbs light within a wavelength range of about 10 μm to about 150 μm (e.g., at 10 μm, 15 μm, 20 μm, 30 μm, 40 μm, 50 μm, 75 μm, 100 μm, or 125 μm) or any sub-range with that range (e.g., 10-15 μm). It can also be selected such that the Weyl semimetal 310 absorbs terahertz radiation (e.g., at 2-30 THz or any frequency within that band).

In operation, incident radiation 401 illuminates the photodetector 400, generating a photocurrent 411 that flows to the load 430. (The incident polarization may be unpolarized, then transformed to a circular polarization state by the polarizer 440 and quarter wave plate 450 as explained above with respect to FIG. 3.) For higher efficiency, the photodetector 400 may also include lenses and/or other optical elements (not shown) that focus the incident illumination 401 to a spot whose size matches the surface area of the Weyl semimetal 410 exposed to the incident illumination 401 via the transparent electrode 420a.

In the Weyl semimetal 410, the photocurrent 411 flows from the transparent electrode 420a to the other electrode 420b in a direction orthogonal to the surface of the Weyl semimetal 410 illuminated by the incident. In FIG. 4A, the photocurrent flows in the vertical direction and can be collected efficiently with the bottom electrode 420b.

Figure 4B:
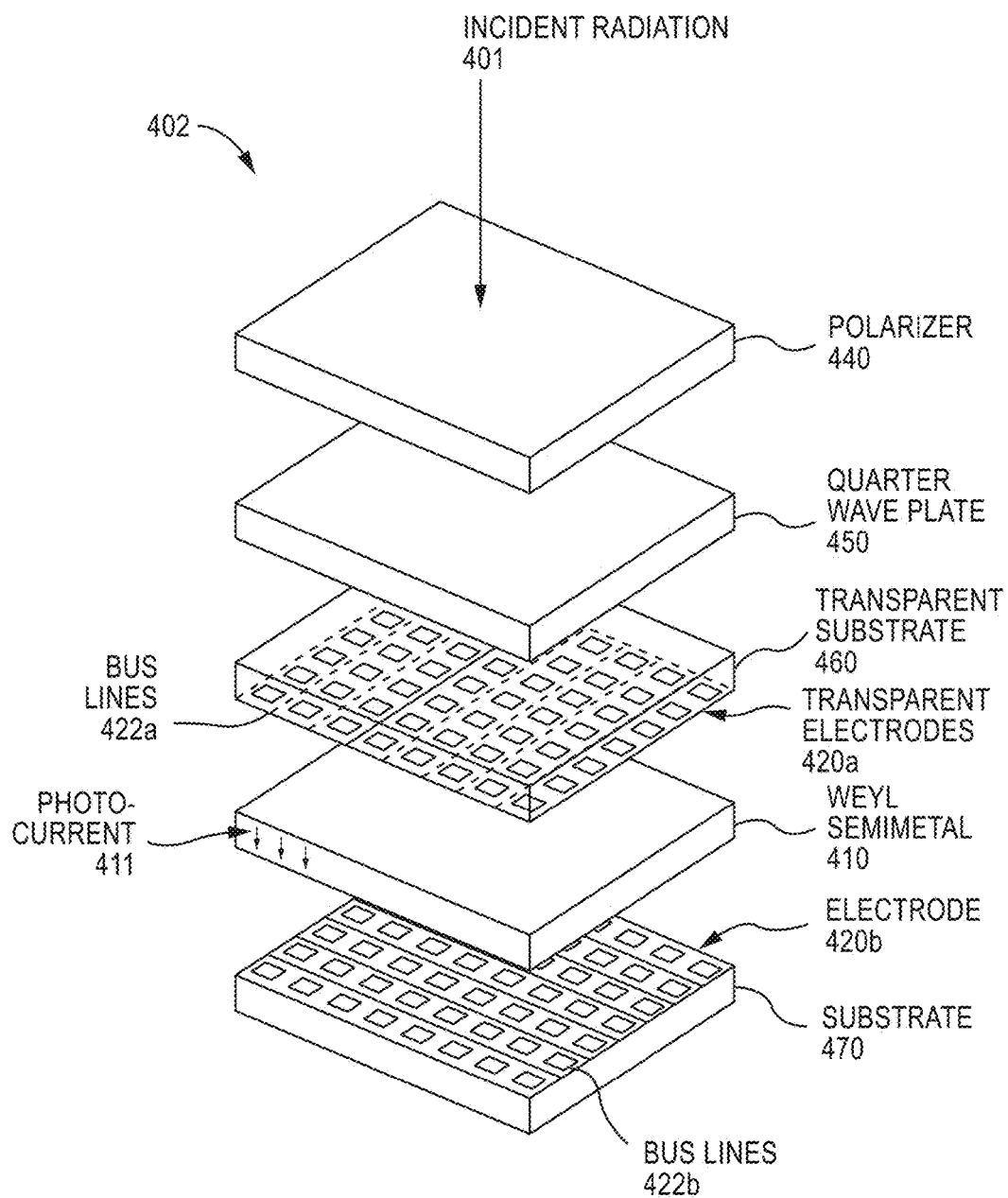
FIG. 4B shows an exploded view of an array of alternative Weyl semimetal photodetectors.

FIG. 4B shows an exploded view of a photodetector array 402 of photodetectors 400. The transparent electrodes 420a are formed of a transparent conductive material, such as ITO, deposited on a transparent substrate 460, which may be made of glass, plastic, or any other suitable material. The transparent electrodes 420a are connected via corresponding conductive row (or column) bus lines 422a as in a thin-film display or complementary metal-oxide-semiconductor (CMOS) detector array. The Weyl semimetal 410 is sandwiched between the face of the transparent substrate 460 coated with the transparent electrodes 420a and another substrate 470. The back electrodes 420b are formed on the surface of the back substrate 470 facing the Weyl semimetal 410 and are connected to corresponding conductive column (or row) bus lines 422b. Compared to a bolometer array, the photodetector array 402 operates with ultrafast response times.

In some cases, the Weyl semimetal 410 is patterned into individual pixels with insulating material between adjacent pixels to avoid or reduce current leakage between neighboring pixels. The pixel size may be chosen to match with the light spot size to increase efficiency. And the pitch size may be roughly equal to the pixel size to avoid interference between different pixels. For example, for a spot size of 50 μm, the pixel size and pitch size can be about 50 μm in both directions. Other pixel sizes and pitches are also possible (e.g., 5 μm, 10 μm, 25 μm, 75 μm, or 100 μm).

Photocurrent Response of a Weyl Semimetal

Without being bound by any particular theory, the photocurrent response of a Weyl semimetal photodetector like those described above can be characterized by the following expressions, starting with the photocurrent generated from a single Weyl spectrum without any symmetry restriction. The low-energy effective Hamiltonian can be generally written as:

$$H_W(\vec{q}) = \hbar v_t q_t \sigma_0 + \hbar v_F \hat{v}_{i,j} q_i \sigma_j \quad (1)$$

where $v_F$ is the Fermi velocity without tilt and $\sigma_j$ are Pauli matrices. $\hat{v}_{i,j}$ represents anisotropy and $x = Det(\hat{v}_{i,j}) = \pm 1$ determines the chirality. $v_t$ gives the tilt velocity and $q_t = \hat{t} \cdot \vec{q}$ with $\hat{t}$ being the tilt direction. The linear Weyl dispersion is given by $$E_{\pm}(\vec{q}) = T(\vec{q}) \pm U(\vec{q}) = \hbar v_t q_t + \hbar v_F [\Sigma_j (\Sigma_i \hat{v}_{i,j} q_i)^2]^{1/2}$$

and the ratio $v_t/v_F$ measures the tilt of the band structure. When $|T(\vec{q})/U(\vec{q})|$ is less than 1 for all $\hat{q}$, the node is in the type-I phase, whereas when it is greater than 1 for some $\hat{q}$, the system is in the type-II regime, in which electron and hole pockets are formed.

The interaction with a monochromatic light characterized by $\vec{A}(t) = \vec{A}_+ e^{-i\omega t} + \vec{A}_- e^{+i\omega t}$ enters through the Peierls substitution, leading to the interaction Hamiltonian $V(t) = V_+ e^{-i\omega t} + V_- e^{+i\omega t}$ with $$V_{\pm} = \hbar v_F \hat{v}_{i,j} A_{\pm,i} \sigma_j. \quad (2)$$

$V_{+(-)}$ describes the spin-dependent photon absorption (emission) process. In the isotropic limit $\hat{v}_{i,j} = \delta_{i,j}$, a circularly polarized light propagating along $q_z$ corresponds to $V_{\pm} = \hbar v_F A \sigma_{\pm}/2$. Zeeman coupling is ignored here because the ratio of Zeeman to orbital couplings is about $g_s \hbar \omega (2mv_F c) \sim 10^{-3}$ based on reported g-factors.

The photovoltaic current can be expressed as $\vec{J} = (-e) \Sigma_{q, l=\pm} [\partial E_l(\vec{q})/\partial q] \times [n_l(\vec{q}) - n_l^0(\vec{q})]$, where $n_{\pm}(\vec{q})$ and $n_{\pm}^0(\vec{q})$ are the perturbed and equilibrium distribution functions, respectively. Within Fermi's golden rule and the relaxation time approximation, each Weyl node contributes a photocurrent density:

$$J_i = \left(\frac{-e\tau\omega^2 A^2}{16\pi^2}\right)\bar{J}_i, \quad (3)$$

with a dimensionless response function $$\bar{J}_i(\omega) = 4\int d^3\left(\frac{vFq}{\omega}\right)\frac{\partial[\Delta E(\vec{q})/\hbar]}{\partial v_F qi}$$

$$\left|\left\langle q_+ \left|\frac{V+}{\hbar v_F A}\right| q_-\right\rangle\right|^2 \times \delta\left(\frac{\Delta E(\vec{q})}{\hbar\omega} - 1\right)[n_l(\vec{q}) - n_l^0(\vec{q})] \quad (4)$$

where $\Delta E = E_+ - E_-$. A relaxation time $\tau$ accounts for disorder and phonon scattering. This response function describes the vertical transition from state $|q_-\rangle$ to $|q_+\rangle$ by absorbing a photon with frequency $\omega$. Each particle-hole excitation produces a current $-e\partial[\Delta E(\vec{q})/\hbar]\partial\vec{q}$ being independent of the tilt. Eq. (4) is a dimensionless number that depends on the tilt $v_t/v_F$ but is independent of $v_F$ for a given tilt. For a single node with negligible tilt, the trace of the response (i.e., $\Sigma_{P_A=\{x,y,z\}} \bar{J}_{i=P_A}$ where $P_A$ is the Poynting vector) is universal and proportional to the chirality. This result survives for finite tilt over a limited range of chemical potentials.

For Weyl semimetals, it is possible to break both TR and I symmetries. In these cases, each Weyl node can have different parameter values and chemical potentials. J coming from different nodes are not symmetry-related and there is no current cancelation. When there is I symmetry, the photocurrents lead to cancelation.

Symmetry Considerations in Weyl Semimetals

Figure 5C:
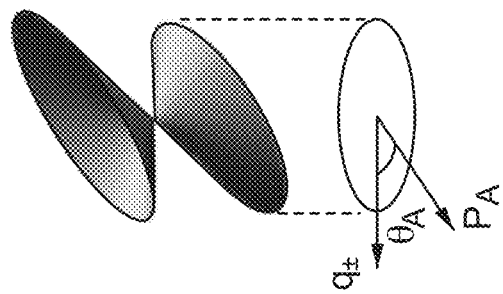
FIG. 5C shows the angle $\theta_A$ between the tilt $q_t$ of the Weyl spectrum and the Poynting vector $P_A$ of the incident light in one of the Weyl cones shown in FIG. 5B.
Figure 5B:
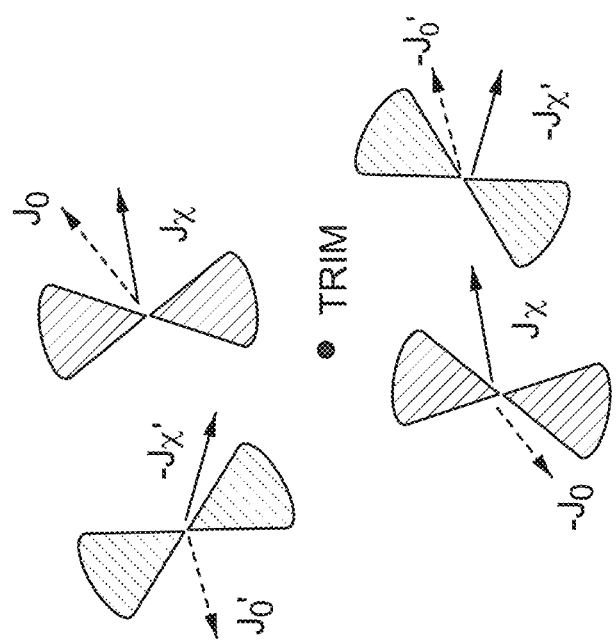
FIG. 5B shows relations between photocurrents in a noncentrosymmetric Weyl semimetal with time reversal invariant momentum (TRIM) that relates a pair of Weyl cones of the same chirality.
Figure 5A:
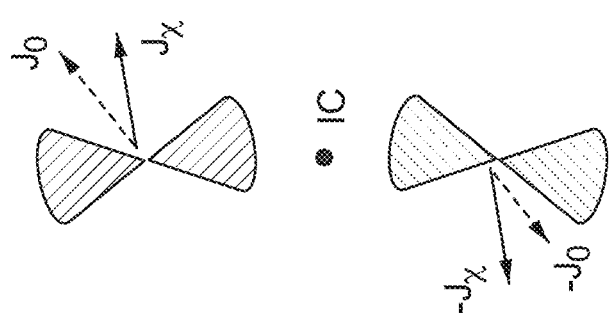
FIG. 5A shows relations between photocurrents in a centrosymmetric Weyl semimetal with an inversion center (IC) between a pair of I-related Weyl nodes with opposite chiralities.

In centrosymmetric Weyl semimetals, a Weyl node at $\vec{k}$ is related to another one at $-\vec{k}$ about an inversion center (IC) as shown in FIG. 5A. Their Hamiltonians take the same form as Eq. (1) with the relations $q_i \leftrightarrow -q_i$ and $\sigma_j \leftrightarrow \sigma_j' = P\sigma_j^{-1}$. The inversion P just changes the basis of $\sigma_j$. Hence, I-related nodes have opposite tilt and opposite chirality. Similarly, with TR symmetry, two Weyl nodes are related about the time reversal invariant momentum (TRIM) with the relations $q_i \leftrightarrow -q_i$ and $\sigma_1 \leftrightarrow -\sigma_1'' = T\sigma_j T^{-1}$, where T is the TR transformation. Thus, two TR-related nodes have opposite tilt but the same chirality as shown in FIG. 5B. Even though each monopole is accompanied by an anti-monopole, there are no symmetry restrictions between them.

The photocurrent depends on the sign of the tilt and the chirality. According to the response function given in Eq. (4), changing $v_t \rightarrow -v_t$ and $\hat{v}_{i,j} \rightarrow -\hat{v}_{i,j}$ is equivalent to changing $\vec{q} \rightarrow -\vec{q}$ and causes the integral in Eq. (4) to yield $\bar{J}_i \rightarrow -\bar{J}_i$. With this relation, the photocurrent from the n-th Weyl node can be decomposed as $$\bar{J}^{(n)}(sgn[v_t^{(n)}],\chi^{(n)}) = sgn[v_t^{(n)}]\bar{J}_o^{(n)} + \chi^{(n)}\bar{J}_\chi^{(n)} \quad (5)$$

This is because the other two components (one is proportional to $sgn[v_t^{(n)}] \times \chi^{(n)}$ and the other is independent on any of them) sum to zero. In. Eq. (5), the first component changes sign for opposite tilts and can be generated by a linearly polarized drive, whereas the second chirality-dependent term is induced by circularly polarized light.

Mirror symmetry is common in realistic Weyl materials. A mirror reflection flips the sign of the Weyl momentum along the mirror axis and relates a monopole to an anti-monopole. However, it may not lead to cancelation of photocurrent because the drive breaks the mirror symmetry of the photocurrent response.

With these symmetry considerations, the overall photocurrent balances out when there is I symmetry. For noncentrosymmetric systems with TR symmetry, two pairs of Weyl nodes can produce a non-zero response $2(\vec{J}_\chi - \vec{J}_\chi')$, where $\vec{J}_\chi$ and $\vec{J}_\chi'$ correspond to the photocurrents from opposite Weyl nodes. The photocurrent relations are graphically summarized in FIGS. 5A and 5B, with FIG. 5C showing that a tilted Weyl cone creates a photocurrent. In a Weyl system without any symmetry, both $\vec{J}_0$ and $\vec{J}_\chi$ can survive. Note that the non-zero photocurrent originates from the different tilts and anisotropies between monopoles and anti-monopoles. Other chemical potential differences can help in a similar way.

Photocurrent by Monochromatic Drives

Consider the dependence of photocurrent in a noncentrosymmetric Weyl semimetal with TR symmetry due to a circularly polarized drive. For illustrative purpose, consider four Weyl nodes, where two monopoles are tilted along $q_z$ with opposite tilt velocities $v_t$ and $-v_t$ and the anti-monopole dispersions are upright. A photon propagates along the $q_x$-$q_z$ plane and is parameterized as $\vec{A}(t) = A(\cos\theta_A \cos\omega t, \xi \sin\omega t, -\sin\theta_A \sin\omega t)$ with $\xi = \pm 1$ controlling the polarization. Below, consider the isotropic limit, i.e., $\hat{v}_{i,j} = \delta_{ij}$.

Figure 6A:
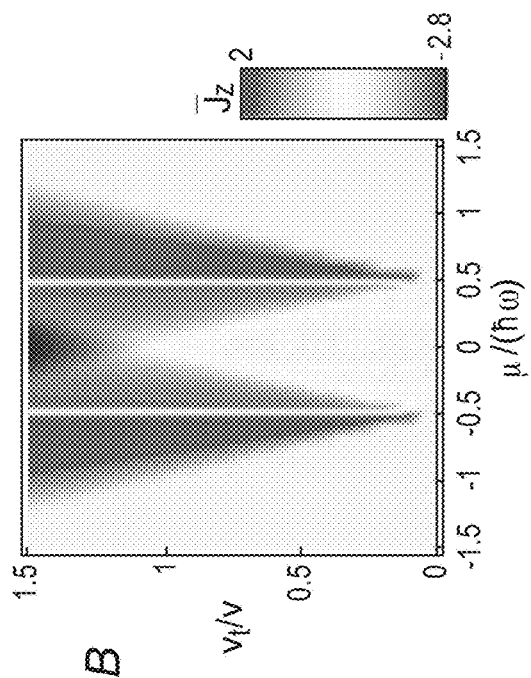
FIG. 6A is a plot of simulated photocurrent versus chemical potential (normalized to the photon energy) at a temperature T=0 and $\theta_A$=0.3 for a noncentrosymmetric Weyl semimetal driven by monochromatic, circularly polarized light at a frequency co at different tilt ratios $v_t/v_F$.

FIG. 6A shows the dimensionless photocurrent response $\bar{J}_z$ at zero temperature with $\theta_A = 0.3$ and finite tilts. When $0 < v_t/v_F < 1$, the signal is nonzero due to asymmetric excitations assisted by the tilt as shown in FIG. 2C. When $|\mu| < |-v_t/v_F + 1|\hbar\omega/2$, the Weyl nodes are symmetrically excited and the chiral photocurrents from the monopoles and the anti-monopoles carry the same magnitudes but opposite directions. As is increased, the magnitudes of both currents decrease in a tilt-dependent manner, resulting in an imbalanced photocurrent $2[\vec{J}_\chi(\mu/\omega) - \vec{J}_\chi'(\mu/\omega)]$. When exceeds $|v_t/v_F + 1|\hbar\omega/2$, vertical transitions are no longer allowed and every current vanishes. The sharp jump of $\bar{J}_z$ at $|\mu| = \hbar\Omega/2$ happens because this is a special case of two untilted Weyl cones and is not a generic feature.

Figure 6B:
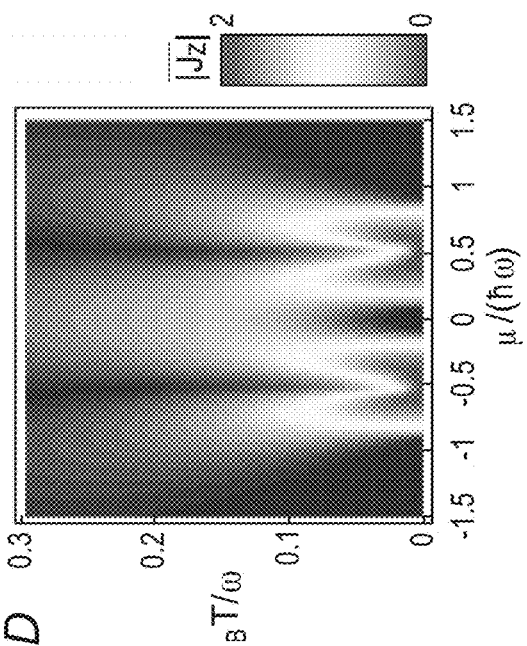
FIG. 6B is a surface plot of simulated photocurrent versus tilt $v_t/v_F$ and chemical potential (normalized to the photon energy) at a temperature T=0 and $\theta_A$=0.3 for a noncentrosymmetric Weyl semimetal driven by monochromatic, circularly polarized light at a frequency ω.
Figure 6C:
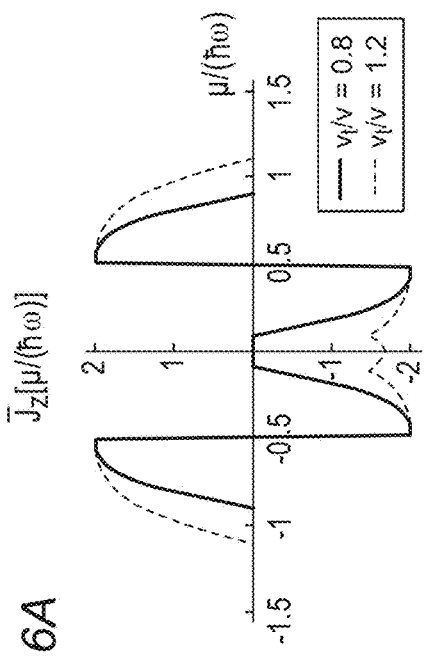
FIG. 6C is a surface plot of simulated photocurrent versus OA and chemical potential (normalized to the photon energy) at a temperature T=0 and $v_t/v_F$=0.8 for a noncentrosymmetric Weyl semimetal driven by monochromatic, circularly polarized light at a frequency ω.

The region for non-vanishing current can be expanded by increasing the tilt. In the type-II Weyl phase with $|v_t| > v_F$, $\bar{J}_z \neq 0$ as long as $|\mu| < |v_t/v_F + 1|\hbar\omega/2$. The photocurrent survives at $\mu = 0$. The reason is that in the type-II regime, the photoexcitation depends strongly on the direction $\hat{q}$ and thus is anisotropic even at the neutrality point. FIG. 6B presents the photocurrent dependence's on tilt and chemical potential. It provides an idea of the working ranges for the photovoltaic effect. $\bar{J}$ is of order one and its sign is controlled by the light polarization. In the isotropic limit, the photocurrent and the Poynting vector of the drive share the same direction as shown in FIG. 6C.

Figure 6D:
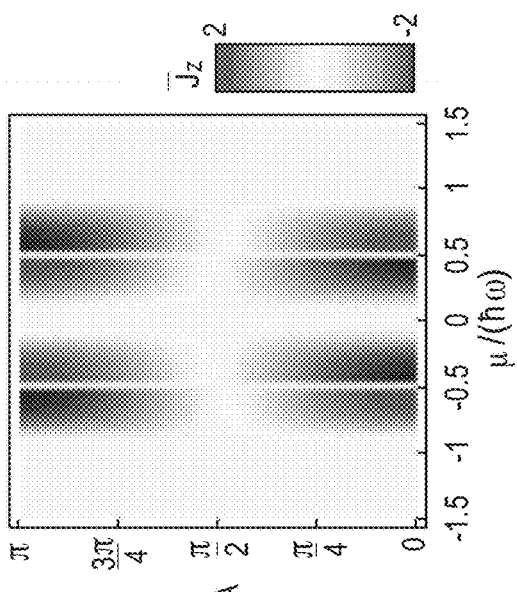
FIG. 6D is a surface plot of simulated photocurrent versus temperature and chemical potential (normalized to the photon energy) at $\theta_A$=0.3 and $v_t/v_F$=0.8 for a noncentrosymmetric Weyl semimetal driven by monochromatic, circularly polarized light at a frequency ω.

FIG. 6D shows the temperature dependence of $|\bar{J}_z|$. It indicates that a sizeable portion of the photocurrent survives with $k_B T \simeq 0.2\hbar\omega$. For an IR radiation with $\hbar\omega \sim 120$ meV and room temperature kBT=26 meV, $\bar{J}$ remains a quarter of its zero-temperature value.

Consider photocurrent density driven by a continuous-wave (CW) $CO_2$ laser. For IR detection applications, the photon energy $\hbar\omega$ is about 120 meV, and a typical laser intensity $I = \epsilon_0 c(\hbar\omega A/e)^2 \sim 10^6$ W m$^{-2}$. At low temperature, the measured T is about 45 ps, corresponding to a long mean free path (about 5 μm). At room temperature, T can be reduced by a factor of 50 as inferred from resistivity measurements. Such a large T implies a weak disorder effect in Weyl semimetals. This suggests a large $|J| \sim 4.3 \times 10^7$ A m$^{-2}$ at low temperature. This result does not require any μ imbalance. Instead, finite tilts and μ are used.

Material candidates to probe this photovoltaic effect include the type-I TaAs family or the type-II compounds, such as $WTe_2$ and $MoTe_2$. For type-I materials with small tilts, the photon energy is $\hbar\omega\sim2\mu$. With a finite tilt, for instance, in $SrSi_2$, which has $v_t/v_F\sim0.6$ and $\mu\sim22$ meV, the detection window can span a wavelength range of about 10 μm to about 50 μm. The operational window becomes even larger for type-II Weyl semimetals according to the plot shown in FIG. 6B.

Using a film geometry reduces or avoids absorption issues. For a system of thickness $L_z$ and area $L_xL_y$ with four Weyl nodes, the number of photons being absorbed ($4L_xL_yL_z \Sigma_q[n+(\vec{q})-n_+^0(\vec{q})]$) and the number of photons from the drive ($I(\omega)L_xL_y\tau/(\hbar\omega)$) provide an estimate of the absorption length scale $L_a\sim 4\pi^2\hbar\epsilon_0 cv_F/(\omega e^2)$ of about 700 nm. An example thin-film device like the photodetector 300 shown in FIG. 3 may have a thickness $L_z \lesssim L_a$.

Contrast the performance of Weyl semimetal photodetectors with other photodetectors using the external quantum efficiency η, which is defined as the ratio of the number of charge carriers to the number of incident photons. For a Weyl semimetal with $L_z=100$ nm and a lateral dimension of a few microns, $\eta=\hbar\omega|J|L_z/(eIL_x)\sim 10^{-3}$ to $10^{-2}$ for mid-infrared frequency light (0.1 eV) at room temperature. In comparison, graphene grown on substrates designed to break I symmetry has a very low η of about $10^{-5}$, possibly due to strong disorder scattering. Compared to devices based on photoconductivity, the carriers in Weyl semimetal photodetector move with a net velocity, giving rise to a current without any background.

Blackbody Radiation Detection

Conventional semiconductor-based photodetectors are limited to wavelengths less than 4 μm due to finite bandgaps. Even in graphene-based devices, photodetection is restricted to the near-infrared regime or suffers from low efficiency.

Weyl semimetal photodetectors can overcome these challenges through the wide wavelength range(s) of their detection windows. According to Planck's law, a blackbody object held at an equilibrium temperature $T_B$ has a continuous radiation intensity spectrum $I(\omega, T_B)=\hbar\omega^3(4\pi^2c^2)^{-1}(e^{\hbar\omega/k_BT}-1)^{-1}$, which is peaked at $\hbar\omega\approx 2.8k_BT$, or 73 meV (or 17 μm) at room temperature. Generalizing Eq. (3) and (4) to take into account the continuous blackbody spectrum, each Weyl node brings about a photocurrent density:

$$J_i^{(b)}(T,\mu) = \left(\frac{-e^3\tau k_B^4 T_b^4}{128\pi^4\hbar^5\epsilon_0 c^3}\right)\bar{J}_i^b$$

$$= \left(\frac{-e^3\tau k_B^4 T_b^4}{128\pi^4\hbar^5\epsilon_0 c^3}\right)\int_0^\infty dx \frac{x^3\bar{J}_i\left(\omega=\frac{xk_BT_b}{\hbar}\right)}{e^x-1}.$$

The prefactor gives the strength of the photocurrent density, while the dimensionless integral corresponds to the dimensionless photocurrent response due to a blackbody radiation.

Figure 7:
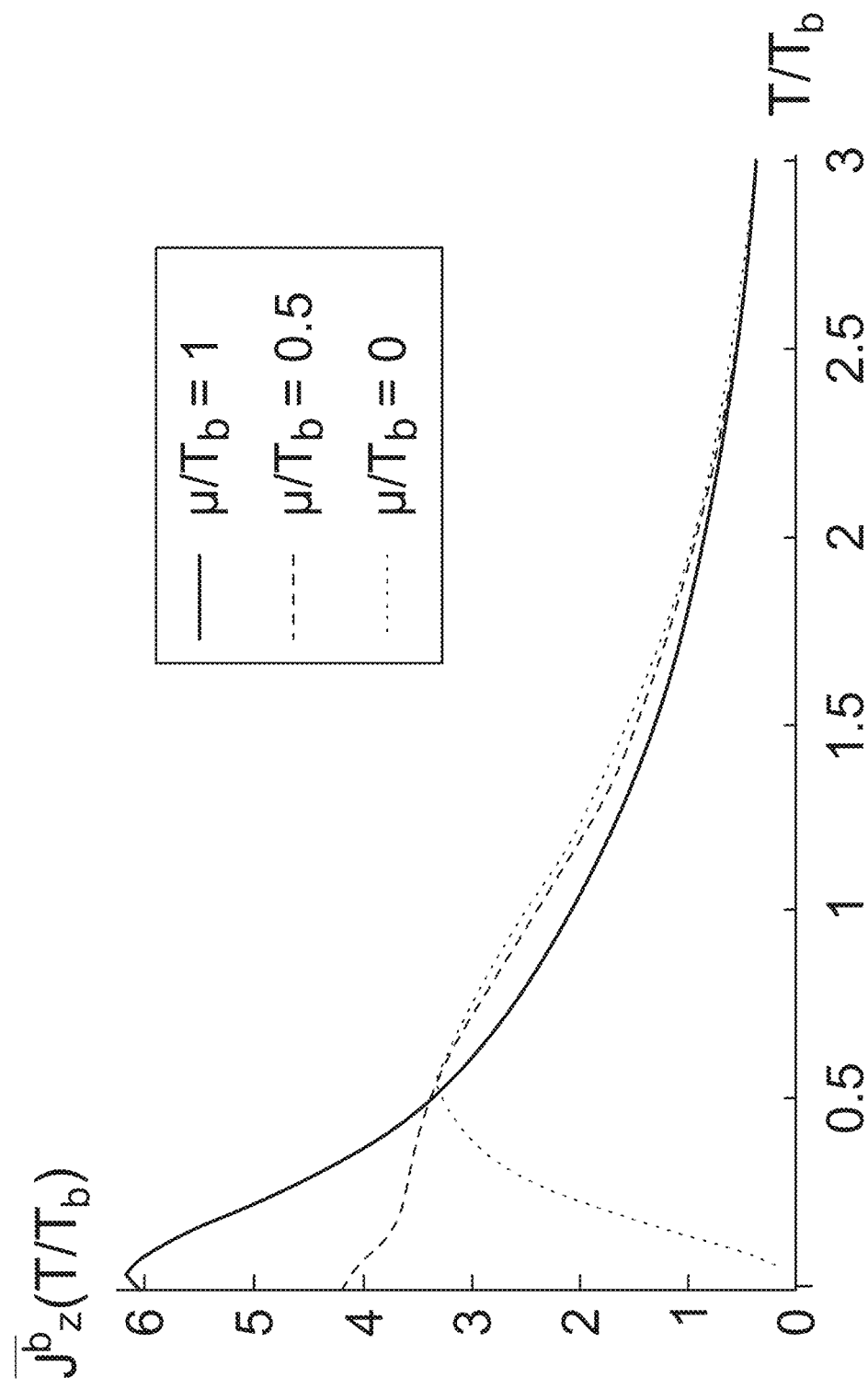
FIG. 7 is a plot of simulated dimensionless photocurrent response versus temperature due to blackbody radiation for Weyl semimetal photodetectors with different chemical potentials.

FIG. 7 shows IR detection performance of a Weyl semimetal photodetector as a function of temperature for various chemical potential values. At a chemical potential μ=0, the photocurrent vanishes at T=0 and steadily increases with temperature until $T\approx 0.5\ T_b$, consistent with FIG. 6D. For finite $\mu=k_BT_b$, the photocurrent drops monotonically with temperature with up to 35% of the photocurrent density survives at $T=T_b$. In other words, up to about one-third of the dimensionless response survives at room temperature, indicating the suitability of Weyl semimetals for detecting IR light. This reduction is comparable to that due to the monochromatic drive shown in FIG. 6D. Note that even for room temperature, the conditions $k_BT\approx k_BT_b\approx\mu\approx 26$ meV can be achieved in realistic Weyl semimetal materials. This estimate gives a magnitude of the photocurrent density as 100 A m$^{-2}$ at room temperature.

Recent experimental results illustrate photocurrents generated by circularly polarized mid-infrared light on the Weyl semimetal TaAs. A mid-infrared $CO_2$ laser (λ=10.6 μm) was used. In order to satisfy the TaAs crystalline symmetry constraints (space group #109, I4$_1$md), the light was shone along the (100) crystalline axis, and the current was collected along (010). The lateral size of the sample was about 300 μm×300 μm and the thickness was about 100 μm. With an incident power of about 10 mW and a beamsize of 50 μm×50 μm, an electrical current of about 40 nA was detected. The efficiency can be further significantly improved by reducing the sample thickness to a level comparable to the skin depth (~100 nm).

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the technology disclosed herein may be implemented using hardware, software or a combination thereof. When implemented in software, the software code can be executed on any suitable processor or collection of processors, whether provided in a single computer or distributed among multiple computers.

The various methods or processes (e.g., of designing and making the technology disclosed above) outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A detector comprising:
a detecting element comprising a noncentrosymmetric Weyl semimetal that produces a photocurrent in response to incident radiation; and
a pair of electrodes, deposited on the detecting element, to conduct the photocurrent out of the noncentrosymmetric Weyl semimetal.

2. The detector of claim 1, wherein the detecting element is configured to produce the photocurrent in an absence of an applied magnetic field.

3. The detector of claim 1, wherein the noncentrosymmetric Weyl semimetal has a three-dimensional band structure comprising a plurality of tilted Weyl cones.

4. The detector of claim 1, wherein the noncentrosymmetric Weyl semimetal has an energy band structure that lacks inversion symmetry.

5. The detector of claim 1, wherein the noncentrosymmetric Weyl semimetal has a chemical potential within about 5 meV of a Weyl node of the noncentrosymmetric Weyl semimetal.

6. The detector of claim 1, wherein the noncentrosymmetric Weyl semimetal has a thickness of substantially equal to or less than an absorption length of the noncentrosymmetric Weyl semimetal at a wavelength of the incident radiation.

7. The detector of claim 1, wherein the noncentrosymmetric Weyl semimetal has a thickness of less than about 1 micron.

8. The detector of claim 1, wherein the noncentrosymmetric Weyl semimetal comprises at least one of $SrSi_2$, TaAs, $WTe_2$, $MoTe_2$, TaP, NbP, NbAs, $Ag_2Se$, $Ta_3S_2$, LaAlGe, PrAlGe, CoSi, or RhSi.

9. The detector of claim 1, wherein the pair of electrodes comprises:
a transparent electrode disposed on a first side of the Weyl semimetal; and
a back electrode disposed on a second side of the Weyl semimetal opposite the first side of the Weyl semimetal.

10. The detector of claim 1, further comprising:
a polarizer to polarize the incident polarization in a linear polarization state; and
a quarter wave plate, in optical communication with the polarizer and the detecting element, to transform the incident radiation from the linear polarization state to a circular polarization state.

11. A detector comprising:
a detecting element comprising a noncentrosymmetric Weyl semimetal that produces a photocurrent in response to incident radiation; and
a pair of electrodes, in electrical communication with the detecting element, to conduct the photocurrent out of the noncentrosymmetric Weyl semimetal,
wherein the detecting element is configured to produce the photocurrent in an absence of an external bias voltage.

12. A method of detecting incident radiation, the method comprising:
illuminating a noncentrosymmetric Weyl semimetal with the incident radiation, the noncentrosymmetric Weyl semimetal generating a photocurrent in response to the incident radiation; and conducting the photocurrent out of the noncentrosymmetric Weyl semimetal via a pair of electrodes deposited on the noncentrosymmetric Weyl semimetal.

13. The method of claim 12, wherein illuminating the noncentrosymmetric Weyl semimetal occurs in an absence of a bias voltage.

14. The method of claim 12, wherein illuminating the noncentrosymmetric Weyl semimetal occurs in an absence of a magnetic field.

15. The method of claim 12, wherein illuminating the noncentrosymmetric Weyl semimetal comprises illuminating the noncentrosymmetric Weyl semimetal with near to far-infrared light.

16. A method of detecting incident radiation, the method comprising:
    illuminating a noncentrosymmetric Weyl semimetal with the incident radiation, the noncentrosymmetric Weyl semimetal generating a photocurrent in response to the incident radiation; and
    conducting the photocurrent out of the noncentrosymmetric Weyl semimetal via electrodes in electrical communication with the noncentrosymmetric Weyl semimetal,
    wherein illuminating the noncentrosymmetric Weyl semimetal comprises illuminating the noncentrosymmetric Weyl semimetal with Terahertz radiation.

17. A method of detecting incident radiation, the method comprising:
    illuminating a noncentrosymmetric Weyl semimetal with the incident radiation, the noncentrosymmetric Weyl semimetal generating a photocurrent in response to the incident radiation; and
    conducting the photocurrent out of the noncentrosymmetric Weyl semimetal via electrodes deposited on the noncentrosymmetric Weyl semimetal,
    wherein illuminating the noncentrosymmetric Weyl semimetal comprises illuminating the noncentrosymmetric Weyl semimetal with circularly polarized radiation.

18. A detector comprising:
    a Weyl semimetal to produce a photocurrent in response to circularly polarized incident radiation, the Weyl semimetal having a tilted Weyl dispersion and an energy band structure lacking inversion symmetry at a wavelength of the circularly polarized incident radiation; and
    a pair of electrodes, in electrical communication with the Weyl semimetal, to conduct the photocurrent out of the Weyl semimetal.

19. The detector of claim 18, wherein:
    the Weyl semimetal has a thickness of substantially equal to or less than an absorption length and defines a surface configured to receive the circularly polarized incident radiation; and
    the pair of electrodes comprises a first electrode at a first edge of the surface and a second electrode at a second of the surface.

20. The detector of claim 18, wherein:
    the Weyl semimetal has a thickness greater than an absorption length and defines a first surface configured to receive the circularly polarized incident radiation; and
    the pair of electrodes comprises a transparent electrode disposed on the first surface and a back electrode disposed on the a second surface of the Weyl semimetal, the second surface being opposite the first surface.

* * * * *